(12) United States Patent
El Khourassani et al.

(10) Patent No.: US 10,997,107 B2
(45) Date of Patent: May 4, 2021

(54) TRANSACTION ROUTING FOR SYSTEM ON CHIP

(71) Applicant: STMicroelectronics (Rousset) SAS, Rousset (FR)

(72) Inventors: Yassine El Khourassani, Antibes (FR); Patrick Valdenaire, Roquefort les Pins (FR); Emmanuel Ardichvili, Valbonne (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/504,794

(22) Filed: Jul. 8, 2019

(65) Prior Publication Data
US 2020/0026679 A1 Jan. 23, 2020

(30) Foreign Application Priority Data

Jul. 17, 2018 (FR) ...................................... 1856583

(51) Int. Cl.
*G06F 13/40* (2006.01)
*G06F 13/16* (2006.01)
*G06F 13/18* (2006.01)

(52) U.S. Cl.
CPC ...... *G06F 13/4027* (2013.01); *G06F 13/1668* (2013.01); *G06F 13/18* (2013.01)

(58) Field of Classification Search
CPC .... G06F 9/4812; G06F 9/45533; G06F 9/468; G06F 12/06; G06F 12/0897; G06F 13/4027; G06F 13/1668; G06F 13/18; G06F 13/1663; G06F 13/1673; G06F 13/1684; G06F 13/1642; G06F 15/7807;
(Continued)

(56) References Cited

U.S. PATENT DOCUMENTS

| 7,318,134 | B1 * | 1/2008 | Oliveira | ............. | G06F 11/1471 |
| | | | | | 711/161 |
| 2004/0193837 | A1 * | 9/2004 | Devaney | ............. | G06F 9/30141 |
| | | | | | 712/3 |

(Continued)

OTHER PUBLICATIONS

Gerstlauer, Andreas. "EE382V: System-on-a-Chip (SoC) Design", 2014, University of Texas at Austin. (Year: 2014).*

(Continued)

*Primary Examiner* — Henry Tsai
*Assistant Examiner* — John B Roche
(74) *Attorney, Agent, or Firm* — Slater Matsil, LLP

(57) ABSTRACT

A system on chip includes an interconnect circuit including at least p input interfaces and at least k output interfaces, p source devices respectively coupled to the p input interfaces and k access ports respectively coupled to the k output interfaces and belonging to a target that includes one or more target devices. Each source device is configured to deliver transactions to the target via one of the access ports. An associated memory of each access port is configured to temporarily store the transactions received by the access port. The target is configured to deliver, for each access port, a fill signal representative of a current fill level of its associated memory. A control circuit is configured to receive the fill signals from the access ports and select the access ports eligible to receive a transaction depending on the current fill levels.

22 Claims, 2 Drawing Sheets

(58) Field of Classification Search
CPC ... G06F 13/362; G11C 7/1075; G11C 7/1051; G11C 7/1078
See application file for complete search history.

(56) References Cited

U.S. PATENT DOCUMENTS

2007/0162825 A1* 7/2007 Wang ................ G06F 13/4286
714/763
2015/0364162 A1* 12/2015 D'Abreu ............ G06F 12/0246
711/103

OTHER PUBLICATIONS

M. Venkateswara Rao, et al., "A Frame work on AMBA bus based Communication Architecture to improve the seal Time Computing Performance in MPSoC", International Journal of Computer Applications, vol. 91, No. 5, Apr. 18, 2014, pp. 1-5.

Sudeep Pasricha, et al., "On-Chip Communication Architecture Standards", Systems on Silicon: On-Chip Communication Architectures: System on Chip Interconnect, Chapter 3, Morgan Kaufmann, 2010, pp. 90-96.

Gerstlauer, Andreas, Lecture notes, EE382V:System-on-a-Chip (SoC) Design, University of Texas at Austin, Lecture 12—SoC Communication Architectures, 43 pages, downloaded Jul. 4, 2019.

* cited by examiner

TRANSACTION ROUTING FOR SYSTEM ON CHIP

CROSS-REFERENCE TO RELATED APPLICATIONS

This application claims priority to French Patent Application No. 1856583, filed on Jul. 17, 2018, which application is hereby incorporated herein by reference.

TECHNICAL FIELD

Modes of implementation and embodiments of the invention relate to the routing of transactions within a system on chip (SoC).

BACKGROUND

A system on a chip or system on chip (SoC) is an integrated circuit that integrates all components of a computer or other electronic system. These components typically include a central processing unit (CPU), memory, input/output ports and secondary storage, which are all integrated on a single substrate.

Transactions are routed between source devices and access ports belonging to circuits such as a multiport memory. Sometimes the number of access ports is lower than that of the source devices.

The access ports generally comprise a memory (for example, stacks of 'first input first output' or FIFO type) that is intended to temporarily store the transactions received by the access ports.

SUMMARY

Modes of implementation and embodiments of the invention relate to the routing of transactions between source devices and access ports belonging to at least one target device, for example, but without limitation, a multiport memory, within a system on chip (SoC), the number of access ports being lower than that of the source devices.

Embodiments of the invention are able to manage such routing so as to offer better use of the memory of the access ports. Embodiments can also avoid, as far as possible, access blockages and routing congestion, in particular when some source devices take priority with respect to other ones.

According to one aspect, what is proposed is a system on chip, comprising an interconnect circuit (also known to those skilled in the art under the name 'interconnect') including at least p input interfaces and at least k output interfaces, where p is greater than k. p source devices are respectively coupled to the p input interfaces and k access ports are respectively coupled to the k output interfaces and belonging to at least one target device (for example a multiport memory), or even to a plurality of target devices. Each source device is configured to deliver transactions (for example read or write transactions) to the at least one target device via one of the access ports.

Transactions emitted by different source devices may be emitted sequentially or simultaneously.

When a plurality of target devices are provided, all of them may receive transactions coming from all of the source devices, or else some of these target devices may receive transactions from only some of the source devices.

Each access port includes a memory (for example a stack of 'first input first output' (FIFO) type) configured to temporarily store the transactions received by the access port.

The at least one target device, for example an access port controller of this target device, is configured to deliver, for each access port, a fill signal representative of the current fill level of its memory.

The system also includes a control module configured to receive the current fill signals from the memory of the access ports and select the access ports eligible to receive a transaction, depending on the current fill level of their associated memory.

Thus, it is possible to offer better use of the memory of the access ports and reduce the risk of having congestion (bottleneck) states.

According to one embodiment, the control module selects an access port as being eligible if the current fill level of its associated memory is lower than a lower threshold, and no longer considers it to be eligible as soon as this current fill level exceeds an upper threshold.

The feedback signals on the status of the ports (fill level of the memory) thus make it possible to establish a list of eligible ports using a hysteresis method.

An access port then joins the list of the eligible ports as soon as the fill level of its associated memory is below the lower threshold, but leaves this list only if this fill level has exceeded the upper threshold.

The update frequency of the fill levels of the access ports is able to be modulated and may be adjusted depending on the application.

That being the case, it is advantageous for the at least one target device to be configured to update the value of the current fill level of the memory associated with each access port after each input or each output of a transaction into the or from the memory.

According to one mode of implementation, the control module is configured to assign the eligible access ports to the source devices depending at least on the current fill levels of their memory.

When each source device is assigned an indication representative of its degree of priority, the control module is configured to assign the eligible access ports to the source devices depending on the current fill levels of their memory and on the degrees of priority.

In other words, the control module in this case implements an access port assignment algorithm offering a dynamic temporal change of the routing depending not only on the filling of the access ports but also depending on the degrees of priority of the source devices.

The risk of congestion in the routing of the transactions is thus further reduced.

Several access port assignment algorithms are possible for implementing this dynamic change of the routing.

Thus, according to one non-limiting example, in which each source device is assigned an indication representative of its degree of priority, the control module is configured to sequentially and respectively assign, to the source devices taken in their decreasing degree of priority, the access ports taken sequentially in their increasing current fill level until the available eligible access ports are exhausted, and then to sequentially and respectively assign, to the remaining source devices taken in their decreasing degree of priority, the already-assigned access ports taken sequentially in their decreasing fill level.

Thus, for example, in the list of the source devices, the degree or order of priority is decreasing (the source device of rank 1 in the list has a higher priority than the source device of rank 2, and so on).

By contrast, in the list of the eligible access ports, the order of the fill level of the ports is increasing (the memory (internal FIFO) of the port of rank 1 in the list contains fewer elements than the memory of the port of rank 2, and so on).

Plus, for example, the source devices are assigned (by increasing ranks) to the ports (the highest-priority source device is assigned to the eligible port whose internal memory has most space) while complying with a bijection relationship until possible exhaustion of available ports. The remaining source devices are then assigned to ports already in use, by decreasing rank.

The benefit of such an assignment algorithm, which runs through the list of the access ports again but in the reverse direction once the eligible ports are assigned to the priority source devices, is that of avoiding using ports (the first ones in the list) already being used by the highest-priority source devices (the first ones in the list of the source devices).

In other words, such an exemplary assignment algorithm is well-suited to managing congestion situations by giving priority to the priority source devices (reversing the running through of the list of the access ports, starting with the last one used once the bijective assignments have been made).

That being the case, as indicated above, this exemplary algorithm is non-limiting, and it would be possible for example to give priority to the use of the most favorable access ports (that is to say those whose memory have the lowest fill levels), this time by looping the algorithm back to the start of the list of the access ports.

Moreover, the control module may advantageously be configured to deliver, to the interconnect circuit, in the presence of each transaction coming from a source device, a control word designating the access port assigned to this source device, the interconnect circuit then being configured to route the transaction from the corresponding input interface to the output interface coupled to this access port and deliver the transaction to the designated access port.

Thus, the interconnect circuit is configured to receive a control word with each transaction and to route the transaction to one of the access ports depending on the value of this control word.

Moreover, regardless of the access port chosen for a transaction coming from a source device, the content, delivered to the access port, of this transaction is identical to the content, delivered by the source device, of the transaction.

In other words, if for example the target device is a multiport memory, and if the transaction includes a write address in the memory, the transaction should not be modified by the control word, such that its content is identical regardless of the access port of the memory, such that the transaction makes it possible to point to the same address in the memory space of the memory, whether the transaction is received on one or the other of the access ports.

In other words, the control word is interpreted locally in the interconnect circuit so as to define the destination output interface (destination access port), but is not transmitted to the destination port, such that the transaction points to the same address in the memory space of the memory, whether the transaction is received on one or the other of the access ports.

According to one mode of implementation, one particularly simple way of ensuring that the content, delivered to an access port, of each transaction is identical to the content, delivered by the source device, of the corresponding transaction regardless of the access port selected, is to provide for each transaction to be routed together with the control word to the corresponding output interface and for the output interface to be configured not to deliver the control word to the corresponding access port.

According to one embodiment, each transaction is incorporated within a main word of n bits, whereas the control word includes m additional bits.

The value of m is at least equal to 1 and depends on the number of access ports to be selected.

Thus, if the number of access ports is equal to 2, m may be equal to 1. If the number of access ports is equal to 3 or 4, m will be equal to 2.

The value of the m bits makes it possible to designate the access port assigned to the source device.

Each input interface is then configured to receive an overall word of n+m bits including the main word of n bits and the control word of m bits.

The interconnect circuit is then advantageously configured to route the overall word to the corresponding output interface, and the output interface is advantageously configured not to deliver the control word of m bits to the access port.

According to one embodiment, each input interface is coupled to the corresponding source device by an input bus with n tracks and to the control module by a control bus with m tracks.

The overall word of n+m bits is intended to be routed on a network of internal buses with n+m tracks within the interconnect circuit.

Each output interface is configured to receive an internal bus of n+m bits and is coupled to the corresponding access port by an output bus with n tracks, and the m tracks of the internal bus with n+m tracks terminating at the corresponding output interface are not connected to the access port.

When the at least one target device is a multiport memory, the transaction includes an address of the physical memory space of the memory.

BRIEF DESCRIPTION OF THE DRAWINGS

Other advantages and features of the invention will become apparent from the detailed description of completely non-limiting embodiments and the appended drawings, in which.

DETAILED DESCRIPTION OF ILLUSTRATIVE EMBODIMENTS

Figure 1:
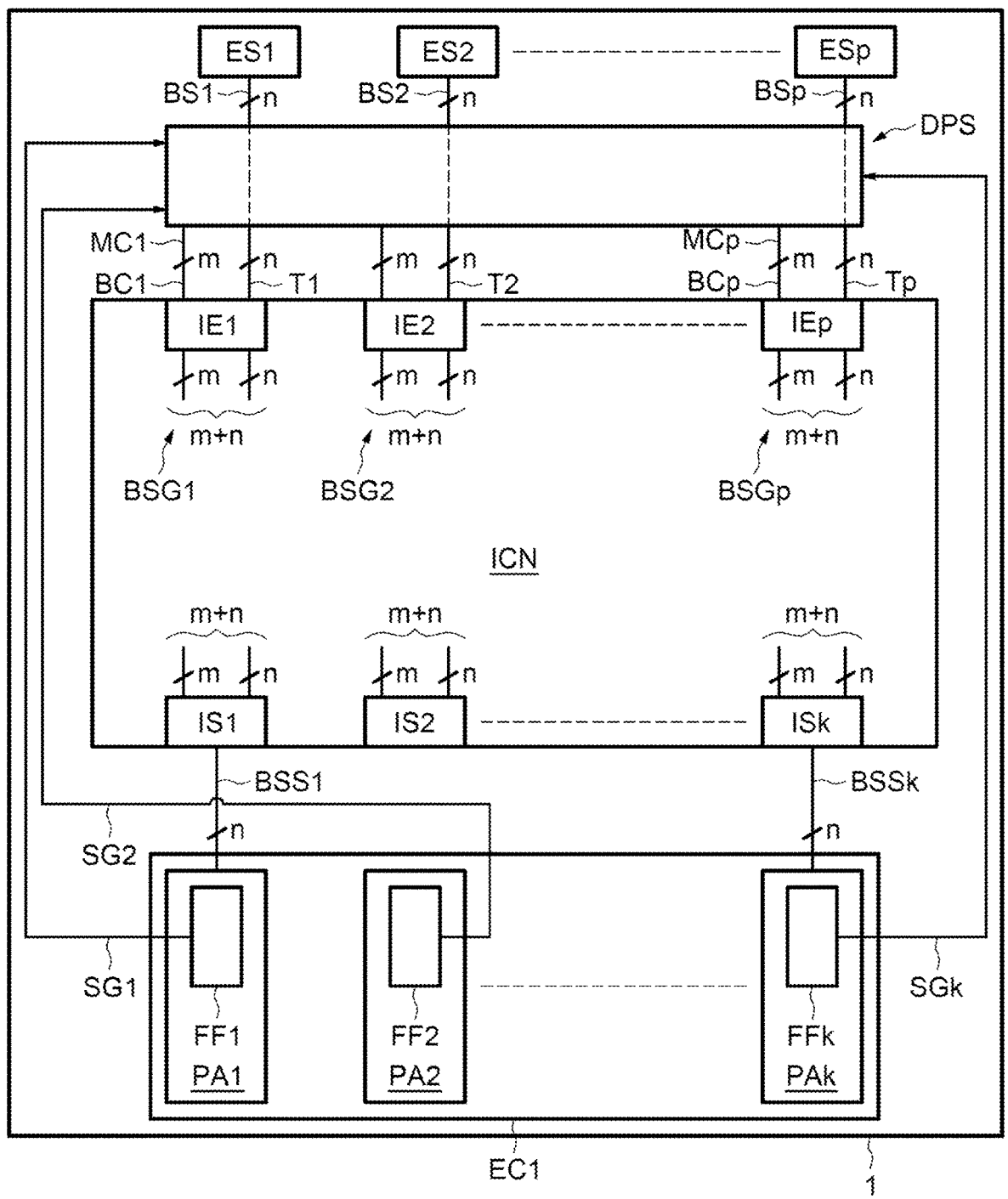
FIGS. 1 to 3 schematically illustrate modes of implementation and embodiments of the invention.

In FIG. 1, the reference 1 denotes a system on chip including a plurality of source devices ES1-ESp that may be of different kinds.

Thus, one of the devices, for example the device ES1, may be an LCD screen controller, another device, for example the device ES2, may be a processor for processing the signal, another source device may be for example a decoder, and another source device, for example the device ESp, may comprise a programmable core or a (micro) processor.

The system on chip 1 also includes at least one target device EC1, for example a multiport memory, in this case a memory including k access ports PA1 to PAk.

It is possible, of course, to provide several target devices of the same or a different kind.

Each access port PAr (r=1 to k) includes a memory, for example an FIFO memory FFr, and the target device EC1 includes an access controller configured to deliver a signal SGr representative of the current fill level of the memory, that is to say representative of the number of transactions present at a current time in the memory, before effectively being delivered to the target device EC1, in this case to the memory space of this target device.

To interconnect the source devices ESi with the access ports PA1-PAk, the system on chip 1 also includes an interconnect circuit ICN.

This interconnect circuit includes input interfaces IE1-IEp that are coupled to the source devices ES1-ESp, respectively, and output interfaces IS1-ISk that are coupled to the access ports PA1-PAk, respectively.

Such an interconnect circuit is capable of routing transactions T1-Tp between the various source devices and the target device(s).

Transactions may be for example write transactions to a memory, if the corresponding target device is a memory, or read transactions.

The structure of such an interconnect circuit, which is generally a multilayer interconnect circuit, and the protocol that allows the transactions to be exchanged and routed within the interconnect circuit are well known to those skilled in the art.

The person skilled in the art may make reference to the article by Venkateswara Rao et al. entitled 'A Framework on AMBA bus based Communication Architecture to improve the Real Time Computing Performance in MPSoC', International Journal of Computer Applications (0975-8887), Volume 91—no. 5, April 2014, or to a general presentation of these interconnect circuits given in 2015 by A. Gerstlauer and available at the web address http://users.ece.utexas.edu/~gerstl/ee382v_f14/lectures/lecture_12.pdf.

Moreover, by way of indication but without limitation, use may be made for example of the interconnect circuit marketed by ARM under the reference NIC-400 (version Rop3).

As illustrated in FIG. 1, each input interface IEi (i=1 to p) of the interconnect circuit ICN is connected to the corresponding source device ESi by an n-bit bus BSi.

The bus is for example a 32-bit bus.

Each transaction coming from a source device ESi is incorporated within a word called 'main word' of n bits conveyed on the bus BSi.

As is known in the art, a transaction, for example a write transaction, contains in particular an address field and control bits and a data field to be written.

For example, the address contained in the transaction may be coded on 16 bits.

The system on chip 1 moreover includes a control module DPS associated with the various source devices ES1-ESp, configured to receive the fill level signals SGr (r=1 to k) and to develop, for each source device ESi, a control word MCi designating the corresponding access port for each transaction.

The access port assignment algorithm, implemented in the control module DPS, will be explored in greater detail hereinafter.

The control words MCi are delivered on control buses BC1-BCp.

Each input interface is therefore coupled to a bus of n+m bits.

In the example described here, the n-bit buses BSi pass through the module DPS. However, they could of course not physically pass through it.

The size of m for each bus BCi depends on the number of access ports.

If there are two access ports for the device EC1, m has the value 1.

The control word will be conveyed on the corresponding bus BCi together with the main word of n bits containing the transaction.

The main word of n bits and the control word of m bits form an overall word of m+n bits.

In general, the various overall words of m+n bits are conveyed to the various output interfaces IS1-ISk by a network of internal buses BSGi of n+m tracks.

Each output interface is therefore configured to receive an internal bus of n+m bits.

By contrast, as illustrated in FIG. 1, only the n tracks of these internal buses that are intended to contain the transaction are connected to the access ports PA1-PAk so as to form output buses BSS1-BSSk.

In other words, the m tracks conveying the control word of m bits are not connected to the corresponding access port.

The transaction delivered to an access port is therefore identical to the transaction coming from a source device, regardless of the selected access port.

Depending on the value of the control word developed by the control module DPS, the transaction coming from the corresponding source device will be routed to one of the access ports PAr.

In fact, in practice, the m control bits are for example the m most significant bits of the address word contained in the transaction.

Thus, if the address word contained in the transaction is a word of 16 bits, the address word conveyed on the network of internal buses of the interconnect circuit is a word of m+16 bits. The interconnect circuit therefore interprets the word of m+16 bits as an address on m+16 bits. Plus, the interconnect circuit is then configured to route this word of m+16 bits to the output interface designated by the value of the m most significant bits.

An interconnect circuit is configured in the conventional way, for example in VHDL language. This VHDL language is then transformed into a hardware circuit including a control circuit, switches and buses and whose various paths are defined by the configuration of the interconnect circuit.

The control module DPS may also be configured in VHDL language. This VHDL language is then transformed into a hardware circuit.

Figure 2:
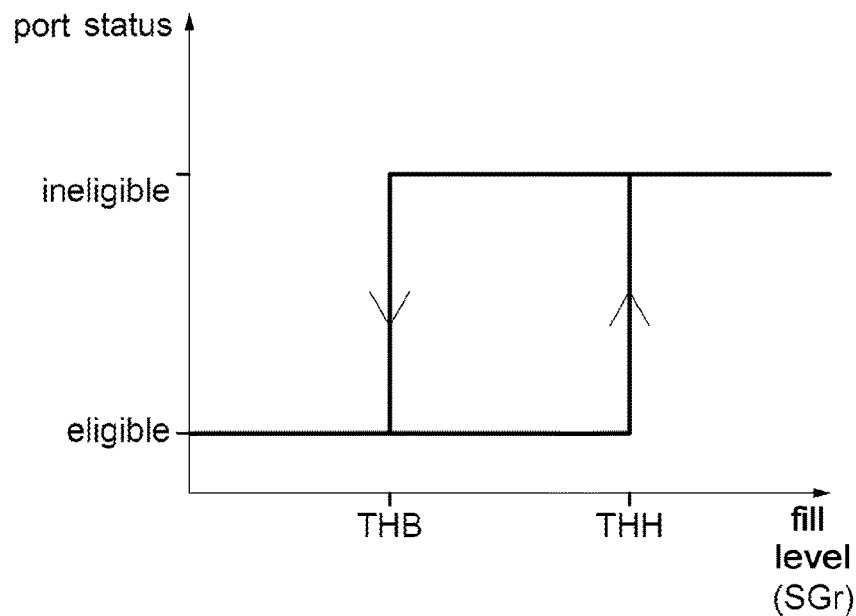
Figure 3:
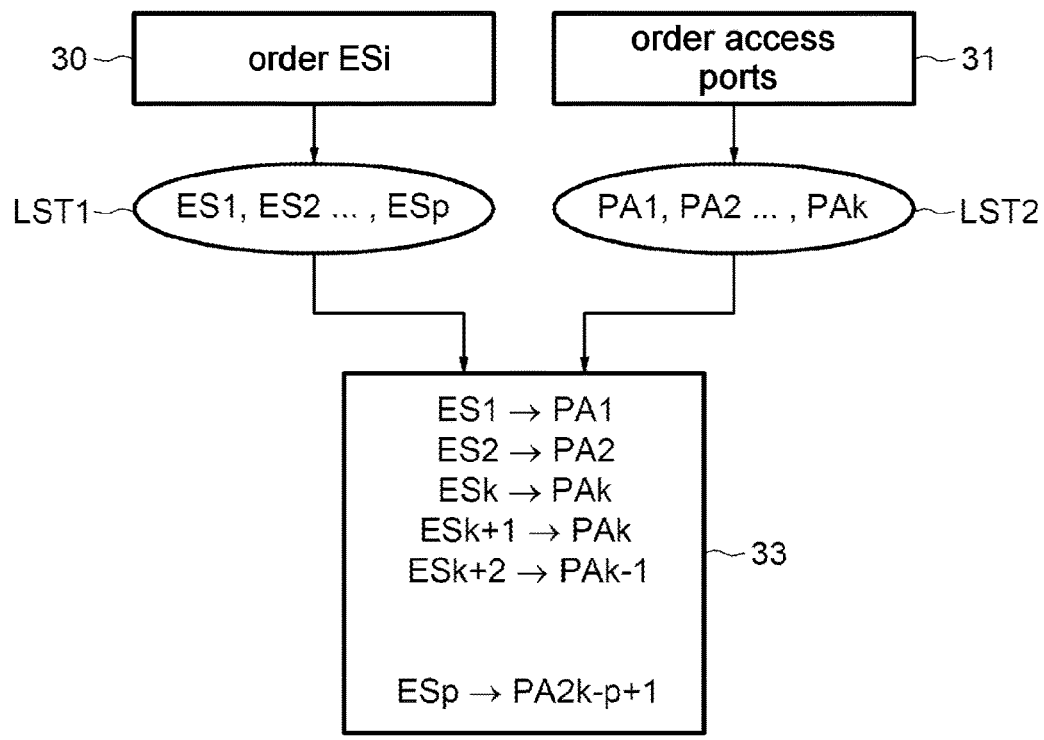

Reference is made more particularly to FIGS. 2 and 3 in order to describe an example of an algorithm for assigning the access ports to the various source devices ES1-ESp.

To avoid congestion in the routing of the transactions, this assignment algorithm will take into account the signals SG1-SGk representative of the fill level of the internal memory FF1-FFk of the various access ports PA1-PAk.

These signals SGr (r=1 to k) are determined by an access port controller of the target device EC1 for example from the position of the address pointers pointing to the various memory portions FFr.

First of all, the control module DPS will determine, from among the various access ports PAr, those that are eligible to receive a transaction.

In this respect, although it is possible to define a single threshold for the fill level of the internal buffer memory, below which an access port would be considered to be eligible to receive a transaction, and above which this same access port would not be considered to be eligible to receive a transaction, it is preferable, as illustrated in FIG. 2, to introduce a hysteresis effect so as to avoid undesired transitions between the eligible or ineligible status of an access port.

More precisely, a lower threshold THB and an upper threshold THH are defined for the fill level.

The upper threshold THH is for example chosen to be as close as possible to the blocking point, while for example keeping some storage space for at least one transaction.

The lower threshold THB is chosen to be lower than THH for the purpose of creating a hysteresis effect and of avoiding having instabilities.

By way of indication but without limitation, the lower threshold THB may be around 50% of the maximum capacity of the memory, whereas the upper threshold THH may be around 80% of this maximum capacity. Thus, for a memory capable of storing 8 transactions, THH may for example be taken to be equal to 6 or 7 and THB equal to 4.

Plus, as illustrated in FIG. 2, an access port will be considered to be eligible to temporarily receive a transaction in its internal memory if the fill level of this internal memory is lower than the lower threshold THB.

By contrast, the status of this access port will be designated as 'ineligible' only if the fill level of the internal memory exceeds the upper threshold THH.

The access controller advantageously updates the value of the signals SGr upon each transaction entering a memory or leaving a memory.

Reference is now made more particularly to FIG. 3 in order to illustrate an example of an algorithm for assigning the access ports to the source devices.

One aim of this assignment algorithm is to avoid as far as possible having two source devices assigned to the same access port, and above all for the highest-priority source devices.

Thus, for each application, the user is able to define a first list LST1 of source devices ordered (step 30) in a decreasing order of priority with respect to the rank of the source device in the list.

In other words, in the example described here, the source device ES1, of rank 1, has a higher priority than the source device ES2 of rank 2, and so on, the source device of rank p having the lowest priority.

This ordering may be performed by way of the source device ESp, which is the microprocessor.

In parallel, the control module DPS orders (step 31) the access ports so as to establish a second list LST2 in which the access ports are ordered with an increasing fill level with respect to their rank.

In other words, in the example described here, in the list LST2 of the access ports PA1-PAk that are all assumed to be eligible, the access port PA1, of rank 1, is the one that has the lowest fill level, whereas the access port PAk, of rank k, is the one that has the highest fill level.

The access port PA2, of rank 2, has a higher fill level than the fill level of the access port PA1 of rank 1.

In other words, the buffer memory of the access port PA1 contains fewer elements (fewer transactions) than the memory of the access port PA2, and therefore has more potential to receive one or more other source devices.

Plus, in a step 33, the control module DPS assigns the source devices ESi to the access port PAr by increasing rank, while complying with a bijection relationship until the available ports are exhausted.

In other words, the highest-priority source device is assigned to the eligible port that has the most space.

Thus, in the example described here, the access port PA1 is assigned to the source device ES1, whereas the access port PA2 is assigned to the source device ES2 and PAk is assigned to the source device ESk.

The remaining source devices are then assigned to access ports already in use, but by decreasing rank.

The use of the access ports (the first ones in the list LST2) already assigned to the highest-priority source devices (the first ones in the list LST1) is thus avoided.

Thus, in the example described here (in which it is considered that k is lower than p and p is lower than or equal to 2k), the access port of rank k will again be assigned to the source device ESk+1.

The access port of rank k−1 will be assigned to the source device ESk+2, and so on, until the access port of rank 2k−p+1 is assigned to the source device ESp of rank p.

What is claimed is:

1. A system on a chip, comprising:
   an interconnect circuit including at least p input interfaces and at least k output interfaces, where p is greater than k;
   p source devices respectively coupled to the p input interfaces;
   k access ports respectively coupled to the k output interfaces and belonging to a target that includes one or more target devices, wherein each access port comprises an associated memory; and
   a control circuit;
   wherein each source device is configured to deliver transactions to the target by the interconnect circuit via one of the access ports;
   wherein the associated memory of each access port is configured to temporarily store transactions received by the access port;
   wherein the target is configured to deliver, for each access port, a fill signal representative of a current fill level of its associated memory; and
   wherein the control circuit is configured to receive, for each access port, the fill signal from the target and select access ports as being eligible to receive a transaction depending on the current fill levels.

2. The system of claim 1, wherein the control circuit is configured to select an access port as being eligible when the current fill level of its associated memory is lower than a lower threshold, and wherein the access port is no longer considered to be eligible when the current fill level of its associated memory exceeds an upper threshold.

3. The system of claim 1, wherein the target is configured to update the current fill level of the associated memory of each access port after each input of a transaction into the associated memory or each output of a transaction from the associated memory.

4. The system of claim 1, wherein the control circuit is configured to assign the access ports selected as being eligible to the source devices depending at least on the current fill levels of the associated memories.

5. The system of claim 1, wherein each source device is assigned an indication representative of a degree of priority and wherein the control circuit is configured to assign the access ports selected as being eligible to the source devices depending on the current fill levels of the associated memories and on the degrees of priority.

6. The system of claim 5, wherein the control circuit is configured to sequentially and respectively assign, to the source devices taken in their decreasing degree of priority, the access ports selected as being eligible taken sequentially in their increasing current fill level until all available access ports selected as being eligible are exhausted.

7. The system of claim 6, wherein the control circuit is further configured to sequentially and respectively assign, to any remaining source devices taken in their decreasing degree of priority, already-assigned access ports selected as being eligible taken sequentially in their decreasing fill level.

8. The system of claim 1, wherein the control circuit is configured to deliver, to the interconnect circuit, along with each transaction coming from a first source device, a control word designating an access port assigned to the first source device, the interconnect circuit being configured to route the each transaction coming the first source device from a corresponding input interface to the output interface coupled to the access port assigned to the first source device and to deliver each transaction coming from the first source device to the access port assigned to the first source device.

9. The system of claim 8, wherein final content of each transaction delivered to any access port of the target is identical to an initial content of corresponding that transaction delivered by the source device, regardless of the access port of the target that is selected.

10. The system of claim 8, wherein each transaction coming from the first source device is routed together with the control word to the output interface coupled to the access port assigned to the first source device, and the output interface coupled to the access port assigned to the first source device is configured not to deliver the control word to the access port assigned to the first source device.

11. The system of claim 10, wherein each transaction coming from the first source device is incorporated within a main word of n bits and the control word comprises m additional bits, m being at least equal to one and being dependent on a number k, and a value of the m additional bits making it possible to designate the access port assigned to the first source device;
  wherein each input interface is configured to receive an overall word of n+m bits comprising the main word and the control word;
  wherein the interconnect circuit is configured to route the overall word of n+m bits to the output interface coupled with the access port assigned to the first source device; and
  wherein the output interface coupled with the access port assigned to the first source device is configured not to deliver the control word to the access port assigned to the first source device.

12. The system of claim 11, wherein each input interface is coupled to a corresponding source device by an input bus with n tracks and to the control circuit by a control bus with m tracks;
  wherein the overall word of n+m bits is intended to be routed on a network of internal buses with n+m tracks within the interconnect circuit; and
  wherein each output interface is configured to receive an internal bus of n+m tracks and is coupled to a corresponding access port by an output bus with n tracks, m tracks of the internal bus with n+m tracks terminating at the output interface not being connected to the corresponding access port.

13. The system of claim 1, wherein the target comprises a multiport memory and each transaction comprises an address of a physical memory space of the multiport memory.

14. A method of comprising:
  having a system on chip that comprises a plurality of source devices and a plurality of access ports belonging to one or more target devices, wherein each access port comprises an associated memory;
  initiating a first transaction to deliver a first information from a first one of the source devices to a first one of the access ports;
  temporarily storing the first information in the associated memory of the first one of the access ports;
  determining a current fill level of the associated memory of the first one of the access ports; and
  determining whether the first one of the access ports is eligible to receive a second transaction based on the current fill level.

15. The method according to claim 14, wherein determining whether the first one of the access ports is eligible to receive the second transaction comprises:
  determining that first one of the access ports is eligible to receive the second transaction when the current fill level is lower than a lower threshold; and
  determining that first one of the access ports is not eligible to receive the second transaction wherein when the current fill level exceeds an upper threshold.

16. The method according to claim 14, wherein determining whether the first one of the access ports is eligible to receive the second transaction comprises determining that the first one of the access ports is eligible to receive the second transaction, and the method further comprises:
  initiating the second transaction to deliver a second information to the first one of the access ports;
  temporarily storing the second information in the associated memory of the first one of the access ports; and
  updating the current fill level of the associated memory of the first one of the access ports after temporarily storing the second information.

17. A method comprising:
  having a system on chip that comprise a plurality of source devices and a plurality of access ports belonging to one or more target devices, wherein each access port comprises an associated memory;
  receiving a plurality of transaction requests to perform transactions to transfer information from the source devices to the access ports;
  determining whether each transaction request can be performed based on whether an access port associated with that transaction is eligible to receive information, which depends on a current fill level of the access port associated with that transaction;
  assigning eligible access ports to the source devices depending on the current fill levels of the associated memories;
  temporarily storing information transferred from the source devices in the associated memory of the access ports determined to be eligible to receive information; and
  updating the current fill level of the associated memory of each access port after inputting information to the associated memory or outputting information from the associated memory.

18. The method according to claim 17, wherein each source device is assigned an indication representative of a degree of priority and wherein assigning eligible access ports comprises assigning eligible access ports to the source devices depending on the current fill levels of the associated memories and on the degrees of priority.

19. The method according to claim 18, wherein assigning eligible access ports comprises sequentially and respectively assigning, to the source devices taken in their decreasing degree of priority, the access ports taken sequentially in their increasing current fill level until all available eligible access ports are exhausted.

20. The method according to claim 19, wherein assigning eligible access ports further comprises sequentially and respectively assigning, to any remaining source devices taken in their decreasing degree of priority, already-assigned eligible access ports taken sequentially in their decreasing fill level.

21. The method according to claim 17, further comprising:
- delivering control words to an interconnect circuit between the source devices and the access ports, the control words designating an access port assigned to each source device;
- for each transaction, routing the transaction from an interconnect circuit input interface coupled to the source device of the transaction to an interconnect circuit output interface coupled to the access port assigned to the source device of the transaction; and
- for each transaction, delivering the transaction to the access port assigned to the source device of the transaction.

22. The method according to claim 21, wherein each transaction comprises transaction information and a transaction control word and wherein the interconnect circuit output interface assigned to the source device of the transaction delivers the transaction information but not the transaction control word to the access port assigned to the source device of the transaction.

* * * * *

UNITED STATES PATENT AND TRADEMARK OFFICE
CERTIFICATE OF CORRECTION

PATENT NO. : 10,997,107 B2  
APPLICATION NO. : 16/504794  
DATED : May 4, 2021  
INVENTOR(S) : Yassine El Khourassani Page 1 of 1

It is certified that error appears in the above-identified patent and that said Letters Patent is hereby corrected as shown below:

In the Claims

In Claim 8, Column 9; Line 8 and 9 delete "route the each" insert --route each--

In Claim 9, Column 9; Line 14 delete "wherein final" insert --wherein a final--

In Claim 9, Column 9; Line 16 delete "corresponding"

In Claim 14, Column 9; Line 63 delete "method of comprising" insert --method comprising--

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*